(12) United States Patent
Peng et al.

(10) Patent No.: US 11,423,957 B2
(45) Date of Patent: Aug. 23, 2022

(54) SENSE AMPLIFIER, MEMORY AND METHOD FOR CONTROLLING A SENSE AMPLIFIER

(71) Applicants: ANHUI UNIVERSITY, Anhui (CN); CHANGXIN MEMORY TECHNOLOGIES, INC., Hefei (CN)

(72) Inventors: Chunyu Peng, Hefei (CN); Junlin Ge, Hefei (CN); Jun He, Hefei (CN); Zhan Ying, Hefei (CN); Xin Li, Hefei (CN); Kanyu Cao, Hefei (CN); Wenjuan Lu, Hefei (CN); Zhiting Lin, Hefei (CN); Xiulong Wu, Hefei (CN); Junning Chen, Hefei (CN)

(73) Assignees: ANHUI UNIVERSITY, Anhui (CN); CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/441,679

(22) PCT Filed: Dec. 25, 2020

(86) PCT No.: PCT/CN2020/139373
§ 371 (c)(1),
(2) Date: Sep. 21, 2021

(87) PCT Pub. No.: WO2022/032965
PCT Pub. Date: Feb. 17, 2022

(65) Prior Publication Data
US 2022/0208235 A1    Jun. 30, 2022

(30) Foreign Application Priority Data

Aug. 13, 2020 (CN) .......................... 202010811687.2

(51) Int. Cl.
*G11C 7/08* (2006.01)
*G11C 7/06* (2006.01)

(52) U.S. Cl.
CPC ................. *G11C 7/08* (2013.01); *G11C 7/062* (2013.01)

(58) Field of Classification Search
CPC .................................. G11C 7/08; G11C 7/062
(Continued)

(56) References Cited

U.S. PATENT DOCUMENTS 6,225,834 B1 *  1/2001  Gang ..................... G01R 19/00
7,167,049 B2 *  1/2007  Lim .......................... H03F 3/45
(Continued)

FOREIGN PATENT DOCUMENTS

CN      210575115 U      5/2020
CN      210606637 U      5/2020
(Continued)

OTHER PUBLICATIONS

International Search Report and English Translation cited in PCT/CN2020/139373 dated May 12, 2021, 19 pages.

*Primary Examiner* — Connie C Yoha
(74) *Attorney, Agent, or Firm* — Cooper Legal Group, LLC

(57) ABSTRACT

The present disclosure provides a sense amplifier, a memory, and a method for controlling a sense amplifier, relating to the technical field of semiconductor memories. The sense amplifier comprises: an amplification module; and a control module, electrically connected to the amplification module; wherein, in an offset compensation stage of the sense amplifier, the control module is used to configure the amplification module to comprise a diode structure, a current mirror structure, and an inverter with an input and an output connected together; and in a first amplification stage of the
(Continued)

sense amplifier, the control module is used to configure the amplification module as an inverter. The present disclosure can realize the offset compensation of the sense amplifier, thereby improving the performance of semiconductor memories.

15 Claims, 9 Drawing Sheets

(58) Field of Classification Search
USPC .......................................... 365/207, 185.21
See application file for complete search history.

(56) References Cited

U.S. PATENT DOCUMENTS

| 2008/0165602 | A1* | 7/2008 | Sutardja et al. ......... G11C 7/00 |
| 2013/0314977 | A1 | 11/2013 | Wang et al. |
| 2019/0007000 | A1* | 1/2019 | Jeong et al. ............ H01F 1/301 |

FOREIGN PATENT DOCUMENTS

| CN | 111383674 A | 7/2020 |
| CN | 111863054 A | 10/2020 |

* cited by examiner

SENSE AMPLIFIER, MEMORY AND METHOD FOR CONTROLLING A SENSE AMPLIFIER

CROSS-REFERENCE TO RELATED APPLICATIONS

The present application claims the priority to the Chinese patent application 202010811687.2, titled "SENSE AMPLIFIER, MEMORY AND METHOD FOR CONTROLLING A SENSE AMPLIFIER", filed on Aug. 13, 2020, which is incorporated herein by reference in its entirety.

TECHNICAL FIELD

The present disclosure relates to the technical field of semiconductor memories, and in particular to a sense amplifier, a memory, and a method for controlling a sense amplifier.

BACKGROUND OF THE PRESENT INVENTION

With the development of novel intensive applications, due to the emergence of new computing modes (in-memory computing) and the continuous increase in the number of on-chip processor cores, semiconductor memory devices have become more and more important. Depending upon whether the data stored in the semiconductor memory devices will be lost when they are powered off, the semiconductor memory devices may be divided into two categories: volatile memories (the stored data will be lost when they are powered off) and non-volatile memories (the stored data will not be lost when they are powered off). The volatile memories include static random access memories (SRAMs) and dynamic random access memories (DRAMs). The non-volatile memories include read-only memories (ROMs), programmable read-only memories (PROMs), electrically programmable read-only memories, electrically erasable programmable read-only memories (EEPROMs), NAND flash memories, NOR flash memories, phase change RAMs (PRAMs), magnetic RAMs (MRAMs), resistive RAMs (RRAMs), ferroelectric RAMs (FeRAMs), etc. Among the volatile memories, DRAMs have become the mainstream semiconductor memories due to their advantages of high bandwidth, low latency, low cost, and low power consumption.

In a DRAM, the sense amplifier is used to read the data in a storage unit, and has a bit line BL (reading bit line) input terminal and a bit line BLB (reference bit line) input terminal. In the read operation (or refresh operation), the sense amplifier functions to read a voltage difference between the read bit line BL and the reference bit line BLB, and amplify the voltage difference between the two bit lines.

The sense amplifier comprises metal-oxide semiconductor field effect transistors (MOSFETs). However, in the semiconductor technology, due to changes in process and temperature, theoretically the same two MOSFETs may be mismatched, that is, they have different characteristics, resulting in imbalance noise in the sense amplifier. The imbalance noise may seriously affect the performance of semiconductor memories.

It should be noted that the information disclosed in the background section is only provided to enhance the understanding of the background of the present disclosure, and therefore may include information that does not constitute the existing technologies known to a person of ordinary skill in the art.

SUMMARY OF THE PRESENT INVENTION

The purpose of the present disclosure is to provide a sense amplifier, a memory, and a method for controlling a sense amplifier, so as to at least to some extent prevent the performance of semiconductor memories from being affected by the mismatch of transistors in a sense amplifier.

According to a first aspect of the present disclosure, a sense amplifier is provided, comprising: an amplification module; and a control module, electrically connected to the amplification module; wherein, in an offset compensation stage of the sense amplifier, the control module is used to configure the amplification module to comprise a diode structure, a current mirror structure, and an inverter with an input and an output connected together; and in a first amplification stage of the sense amplifier, the control module is used to configure the amplification module as the inverter.

Optionally, the amplification module comprises: a first PMOS transistor; a second PMOS transistor, a gate of the second PMOS transistor being connected to a drain of the first PMOS transistor through a first node; a first NMOS transistor, a gate of the first NMOS transistor being connected to a first bit line and a drain of the first NMOS transistor being connected to the first node; and a second NMOS transistor, a gate of the second NMOS transistor being connected to a second bit line and a drain of the second NMOS transistor being connected to a drain of the second PMOS transistor through a second node; wherein, in the offset compensation stage of the sense amplifier, the second NMOS transistor is configured as a diode structure, the first PMOS transistor and the second PMOS transistor are configured as a current mirror structure, and the first PMOS transistor and the first NMOS transistor are configured as the inverter with the input and the output connected together.

Optionally, the control module comprises: a first switch, a first terminal of the first switch being connected to the first node, and a second terminal of the first switch being connected to a gate of the first PMOS transistor; a second switch, a first terminal of the second switch being connected to the second terminal of the first switch, and a second terminal of the second switch being connected to the second node; and a third switch, a first terminal of the third switch being connected to the first node, and a second terminal of the third switch being connected to the first bit line; and a fourth switch, a first terminal of the fourth switch being connected to the second bit line, and a second terminal of the fourth switch being connected to the second node; wherein, in the offset compensation stage of the sense amplifier, the first switch, the third switch, and the fourth switch are closed, and the second switch is open.

Optionally, in the offset compensation stage of the sense amplifier, sources of the first PMOS transistor and the second PMOS transistor receive a first voltage, and sources of the first NMOS transistor and the second NMOS transistor are grounded.

Optionally, in the first amplification stage of the sense amplifier, the second PMOS transistor and the second NMOS transistor are controlled to be in a cut-off region, and the first PMOS transistor and the first NMOS transistor are configured as the inverter.

Optionally, the control module further comprises: a fifth switch, a first terminal of the fifth switch being connected to the second node, and a second terminal of the fifth switch being connected to the first bit line; and a sixth switch, a first terminal of the sixth switch being connected to the second bit line, and a second terminal of the sixth switch being connected to the first node; wherein, in the offset compensation stage of the sense amplifier, the fifth switch and the sixth switch are open; and in the first amplification stage of the sense amplifier, the first switch, the third switch and the fourth switch are open, and the second switch, the fifth switch, and the sixth switch are closed.

Optionally, in the first amplification stage of the sense amplifier, the source of the first PMOS transistor receives the first voltage, the source of the first NMOS transistor is grounded, the source of the second PMOS transistor and the source of the second NMOS transistor receive a second voltage; wherein, the second voltage is lower than the first voltage.

Optionally, in a second amplification stage following the first amplification stage of the sense amplifier, the control module is used to configure the amplification module as a cross-coupled amplification structure.

Optionally, in the second amplification stage of the sense amplifier, the first switch, the third switch, and the fourth switch are open, and the second switch, the fifth switch and the sixth switch are closed.

Optionally, in the second amplification stage of the sense amplifier, the sources of the first PMOS transistor and the second PMOS transistor receive the first voltage, and the sources of the first NMOS transistor and the second NMOS transistor are grounded.

Optionally, the sense amplifier further comprises: a pre-charge module, configured to pre-charge the first bit line and the second bit line in a pre-charge stage prior to the offset compensation stage of the sense amplifier. Optionally, in the pre-charge stage of the sense amplifier, the first switch, the second switch, the fifth switch and the sixth switch are open, and the third switch and the fourth switch are closed.

Optionally, in the pre-charge stage of the sense amplifier, the sources of the first PMOS transistor, the second PMOS transistor, the first NMOS transistor, and the second NMOS transistor all receive the second voltage.

According to a second aspect of the present disclosure, a memory is provided, comprising any sense amplifier described above.

According to a third aspect of the present disclosure, a method for controlling a sense amplifier is provided, the sense amplifier comprising an amplification module and a control module, comprising: in an offset compensation stage of the sense amplifier, configuring, by the control module, the amplification module to comprise a diode structure, a current mirror structure, and an inverter with an input and an output connected together; and in a first amplification stage of the sense amplifier, configuring, by the control module, the amplification module as the inverter.

In the technical solutions provided in some embodiments of the present disclosure, by the control of the control module, in the offset compensation stage of the sense amplifier, the amplifier module is configured to comprise a diode structure, a current mirror structure, and an inverter with an input and an output connected together; and in the first amplification stage of the sense amplifier, the amplification module is configured as the inverter. Based on the circuit configuration of the present disclosure, the voltages on the bit lines on both sides of the sense amplifier can be adjusted, so as to compensate for the influence of offset noise on the voltages on the bit lines on both sides of the sense amplifier, thereby improving the performance of semiconductor memories.

It should be understood that the aforementioned general description and following detailed description are merely exemplary and explanatory, and the present disclosure is not limited thereto.

BRIEF DESCRIPTION OF THE DRAWINGS

The drawings herein are incorporated into the specification and constitute a part of the specification. The drawings show embodiments of the present disclosure, and explain, together with the specification, the principle of the present disclosure. Apparently, the drawings to be used in the following description show only some embodiments of the present disclosure. For a person of ordinary skill in the art, other drawings may be obtained according to these drawings, without paying any creative effort. In the drawings.

DETAILED DESCRIPTION OF THE PRESENT INVENTION

Figure 1:
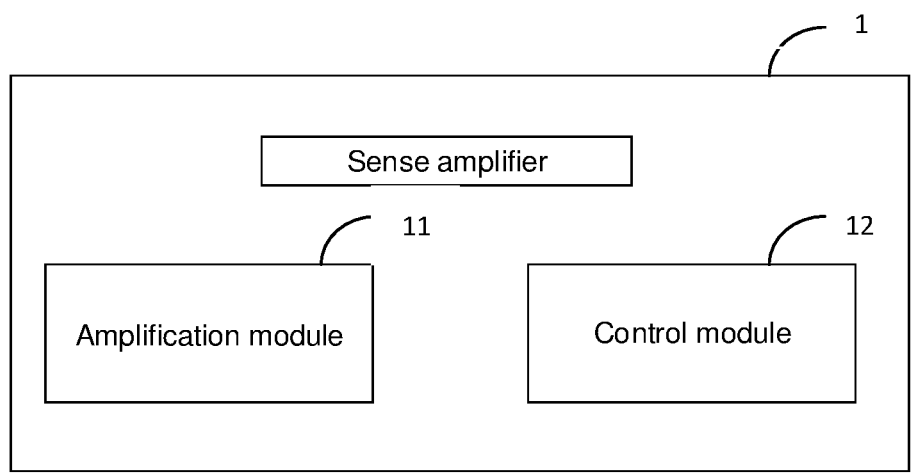
FIG. 1 schematically shows a block diagram of a sense amplifier according to an exemplary implementation of the present disclosure.

Exemplary implementations will now be described more fully with reference to the accompanying drawings. However, the exemplary implementations may be implemented in various forms, and should not be construed as being limited to the examples set forth herein; instead, these implementations are provided to make the present disclosure more comprehensive and complete, and to fully convey the concepts of the exemplary implementations to those skilled in the art. The described features, structures or characteristics may be combined in one or more implementations in any suitable way. In the following description, many specific details are provided to give a sufficient understanding of the implementations of the present disclosure. However, it will be realized by those skilled in the art that the technical solutions of the present disclosure may be practiced without one or more of the specific details, or other methods, components, apparatuses, steps, etc. may be used. In other cases, the well-known technical solutions will not be shown or described in detail in order to avoid obscuring the aspects of the present disclosure.

In addition, the drawings are merely schematic illustrations of the present disclosure, and are not necessarily drawn to scale. The same reference numerals in the figures denote the same or similar parts, and thus the repeated description thereof will be omitted. Terms "first", "second", "third", "fourth", "fifth" and "sixth" are merely used for distinction and should not be considered as any limitation to the present disclosure.

It should be noted that the term "connection", as used herein, may include direct connection and indirect connection. In direct connection, there are no components between terminals. For example, the connection of the first terminal of a switch A to the first terminal of a switch B may mean that there is only a connecting wire (e.g., metal wire) between the first terminal of the switch A and the first terminal of the switch B, without any other components. In indirect connection, there may be other components between the terminals. For example, the connection of the first terminal of a switch C to the first terminal of a switch D may mean that there is at least one other component (for example, a switch E, etc.) on the connection line between the first terminal of the switch C and the first terminal of the switch D, in addition to the connecting wire.

In the sense amplifier, due to the difference in the manufacturing process and the influence of the working environment, there may be difference in size, mobility, threshold voltage, etc., of the transistors. The performance of transistors is usually not completely the same, which will cause the imbalance of the sense amplifier. As a result, imbalanced noise appears and seriously affects the correctness in reading data from the memories.

For example, the sense amplifier comprises two symmetrically configured NMOS transistors. Ideally, the performance of the two NMOS transistors is expected to be exactly the same. However, in practice, the threshold voltages of the two NMOS transistors may be different, which will cause the offset of the circuit. If nothing is done, when reading data from the storage unit, it is possible to read the originally stored "1" as "0", or read the originally stored "0" as "1", both resulting in error output.

In view of this, the present disclosure provides a novel sense amplifier.

FIG. 1 schematically shows a block diagram of a sense amplifier according to an exemplary implementation of the present disclosure. As shown in FIG. 1, the sense amplifier 1 may comprise an amplification module 11 and a control module 12.

The amplification module 11 may be configured to read data in a storage unit on a first bit line or a storage unit on a second bit line; and the control module 12 is electrically connected to the amplification module 11.

In the offset compensation stage of the sense amplifier, the control module 12 is used to configure the amplification module 11 to comprise a diode structure, a current mirror structure, and an inverter with an input and an output connected together.

In the first amplification stage of the sense amplifier, the control module 12 is used to configure the amplification module 11 as an inverter.

Based on the circuit configuration of the present disclosure, the voltages on the bit lines (the first bit line and/or the second bit line) on both sides of the sense amplifier can be adjusted, so as to compensate for the influence of offset noise on the voltages on the bit lines on both sides of the sense amplifier, thereby improving the performance of semiconductor memories.

It should be understood that the offset noise mentioned in the present disclosure refers to the voltage difference caused by the inconsistency of at least two transistors (or components) in the amplification module 11. In the case of integrating the voltage difference between all transistors (or components), the offset noise refers to the offset noise of the entire amplification module 11.

The amplification module 11 may comprise a first PMOS transistor (hereinafter referred to as transistor P1), a second PMOS transistor (hereinafter referred to as transistor P2), a first NMOS transistor (hereinafter referred to as transistor N1), and a second NMOS transistor (hereinafter referred to as transistor N2).

In this case, the offset noise may be the offset voltage of the transistor P1 and the transistor P2, or the offset voltage of the transistor N1 and the transistor N2, or the combination of the two offset voltages, which will not be limited in the present disclosure.

Figure 2:
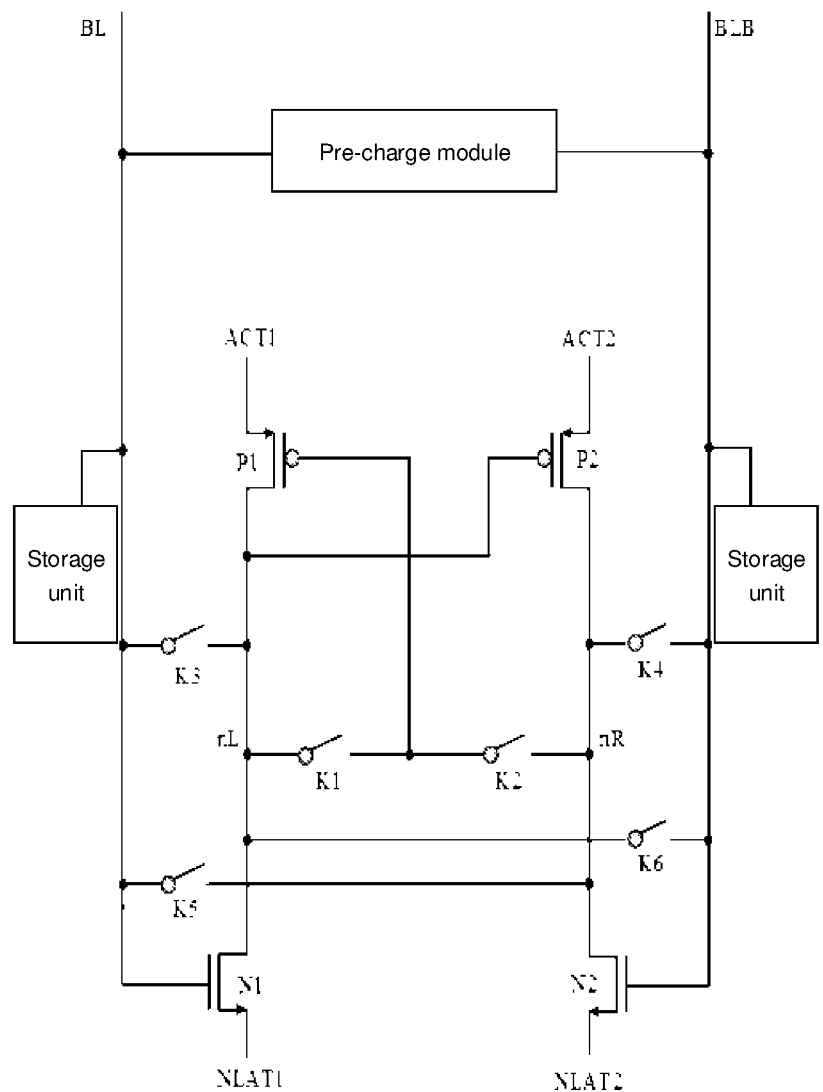
FIG. 2 schematically shows a circuit diagram of a sense amplifier according to an exemplary implementation of the present disclosure.

FIG. 2 schematically shows a circuit diagram of a sense amplifier according to an exemplary implementation of the present disclosure.

Referring to FIG. 2, the drain of the transistor P1 is connected to the gate of the transistor P2, and the drain of the transistor P1 is also connected to the drain of the transistor N1. For the convenience of the following description, a first node nL may be defined in the sense amplifier, and the drain of the transistor P1, the gate of the transistor P2, and the drain of the transistor N1 are connected at the first node nL.

The drain of the transistor P2 is connected to the drain of the transistor N2. For the convenience of the following description, a second node nR may be defined in the sense amplifier, and the drain of the transistor P2 and the drain of the transistor N2 are connected at the second node nR.

In addition, the gate of the transistor N1 is connected to the first bit line BL. The gate of the transistor N2 is connected to the second bit line BLB.

The working stages of the sense amplifier according to the exemplary implementation of the present disclosure may comprise a pre-charge stage, an offset compensation stage, a first amplification stage, and a second amplification stage.

In the offset compensation stage, the transistor N2 may be configured as a diode structure, the transistor P1 and the transistor P2 may be configured as a current mirror structure, and the transistor P1 and the transistor N1 may be configured as an inverter with an input and an output connected together.

The exemplary implementation of the present disclosure realizes the above-mentioned configuration by a control module. Referring to FIG. 2, the control module may comprise a first switch (hereinafter referred to as switch K1), a second switch (hereinafter referred to as switch K2), a third switch (hereinafter referred to as switch K3), and a fourth switch (hereinafter referred to as switch K4).

A first terminal of the switch K1 is connected to the first node nL, a second terminal of the switch K1 is connected to the gate of the transistor P1; a first terminal of the switch K2 is connected to the second terminal of the switch K1, and a second terminal of the switch K2 is connected to the second node nR; a first terminal of the switch K3 is connected to the first node nL, and a second terminal of the switch K3 is connected to the first bit line BL; and, a first terminal of the switch K4 is connected to the second bit line BLB, and a second terminal of the switch K4 is connected to the second node nR.

In the offset compensation stage of the sense amplifier, the switch K1, the switch K3, and the switch K4 are closed, and the switch K2 is open.

The types of the switch K1, the switch K2, the switch K3 and the switch K4 will not be limited in the present disclosure. For example, the switch K1 may be a PMOS transistor, an NMOS transistor or a CMOS transmission gate; the switch K2 may be a PMOS transistor, an NMOS transistor or a CMOS transmission gate; the switch K3 may be a PMOS transistor, an NMOS transistor or a CMOS transmission gate; and the switch K4 may be a PMOS transistor, an NMOS transistor or a CMOS transmission gate.

In some embodiments of the present disclosure, the switch K1 may comprise a control terminal for controlling the on-off state of the switch K1 in response to a first control signal (control signal CM); and the switch K2 may also comprise a control terminal for controlling the on-off state of the switch K2 in response to a second control signal (control signal CC).

The switch K3 may comprise a control terminal for controlling the on-off state of the switch K3 in response to a third control signal (control signal Tran); and the switch K4 may also comprise a control terminal for controlling the on-off state of the switch K4 in response to the third control signal. In other words, the control terminals of the switch K3 and the switch K4 can both receive the third control signal.

In addition, the source of the transistor P1 can receive a fourth control signal (control signal ACT1), the source of the transistor P2 can receive a fifth control signal (control signal ACT2), and the source of the transistor N1 can receive a sixth control signal (control signal NLAT1), and the source of the transistor N2 can receive a seventh control signal (control signal NLAT2).

In the offset compensation stage of the sense amplifier, the sources of the transistor P1 and the transistor P2 both receive the first voltage, wherein the first voltage may be the power supply voltage VCC. That is, in this stage, both the control signal ACT1 and the control signal ACT2 are configured as the first voltage.

In this stage, the sources of the transistor N1 and the transistor N2 are grounded, that is, the voltage received by the control signal NLAT1 and the control signal NLAT2 is zero.

In the first amplification stage of the sense amplifier, the transistor P2 and the transistor N2 are controlled to be in a cut-off region, and the transistor P1 and the transistor N1 are configured as an inverter.

In order to realize this configuration, referring to FIG. 2, the sense amplifier according to the present disclosure may further comprise a fifth switch (hereinafter referred to as K5) and a sixth switch (hereinafter referred to as K6).

A first terminal of the switch K5 is connected to the second node nR, and a second terminal of the switch K5 is connected to the first bit line BL; and a first terminal of the switch K6 is connected to the second bit line BLB, and a second terminal of the switch K6 is connected to the first node nL.

Similarly, the type of the switch K5 and the switch K6 will not be limited in the present disclosure. For example, the switch K5 may be a PMOS transistor, an NMOS transistor or a CMOS transmission gate; and the switch K6 may be a PMOS transistor, an NMOS transistor or a CMOS transmission gate.

In some embodiments of the present disclosure, the switch K5 may comprise a control terminal for controlling the on-off state of the switch K5 in response to an eighth control signal (control signal ISO); and the switch K6 may also comprise a control terminal for controlling the on-off state of the switch K6 in response to the eighth control signal. In other words, the control terminals of the switch K5 and the switch K6 can both receive the eighth control signal.

In the offset compensation stage of the sense amplifier, the switch K5 and the switch K6 are open. In the first amplification stage of the sense amplifier, the switch K1, the switch K3, and the switch K4 are open, and the switch K2, the switch K5, and the switch K6 are closed.

In addition, in the first amplification stage of the sense amplifier, the source of the transistor P1 receives the first voltage, that is, the control signal ACT1 is VCC; the source of the transistor N1 is grounded; and the sources of the transistor P2 and the transistor N2 receive the second voltage. The second voltage enables the transistor P2 and the transistor N2 to be in the cut-off region, wherein the second voltage is lower than the first voltage. In one embodiment, the second voltage may be VCC/2.

In a second amplification stage following the first amplification stage of the sense amplifier, the control module is further used to configure the amplification module as a cross-coupled amplification structure.

Specifically, in the second amplification stage, the switch K1, the switch K3, and the switch K4 are open, and the switch K2, the switch K5, and the switch K6 are closed. Furthermore, the sources of the transistor P1 and the transistor P2 receive the first voltage, that is, the control signal ACT1 and the control signal ACT2 are VCC. The sources of the transistor N1 and the transistor N2 are grounded, that is, the control signal NLAT1 and the control signal NLAT2 are zero.

In addition, the sense amplifier further comprises: a pre-charge module, used to pre-charge the first bit line and the second bit line in a pre-charge stage prior to the offset compensation stage of the sense amplifier.

In the pre-charge stage, the switch K1, the switch K2, the switch K5, and the switch K6 are open, and the switch K3 and the switch K4 are closed. In addition, the sources of the transistor P1, the transistor P2, the transistor N1, and the transistor N2 all receive the second voltage.

Figure 3:
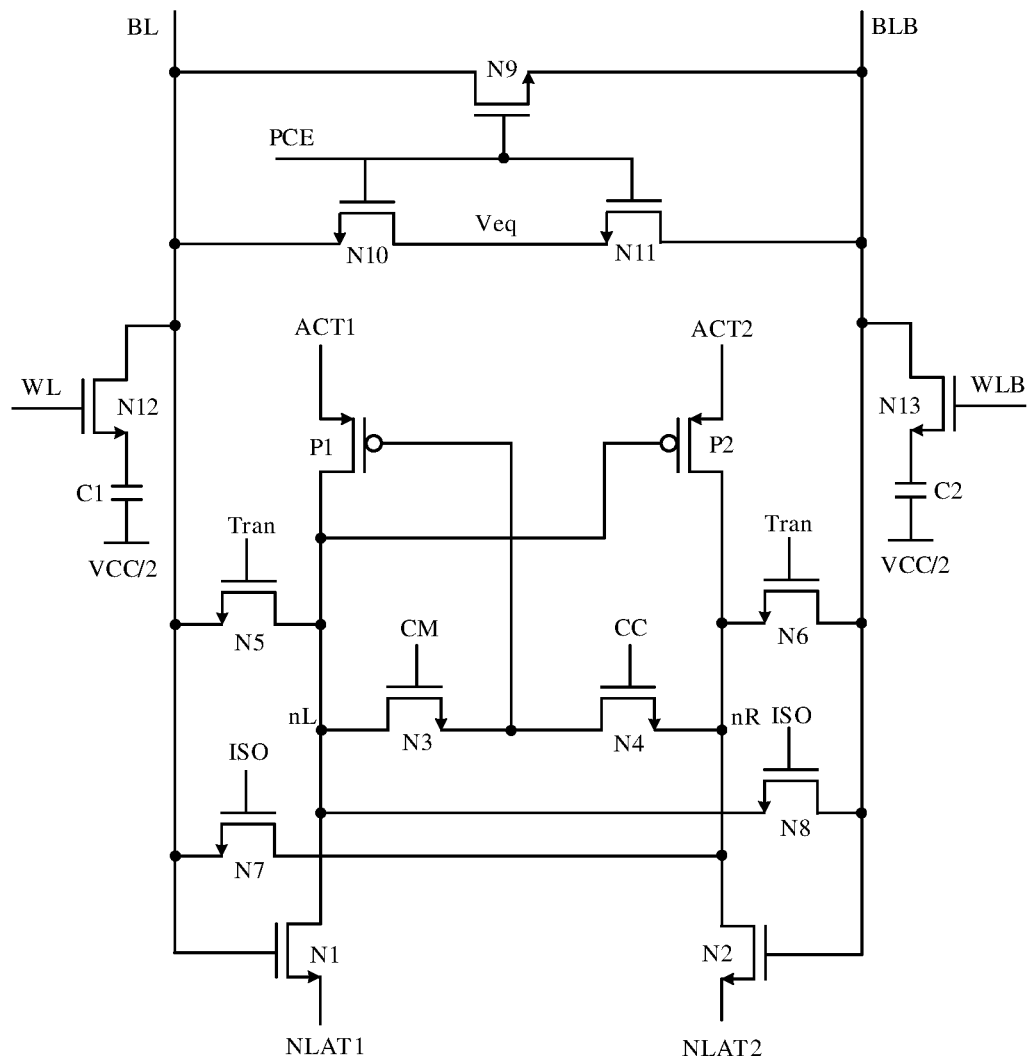
FIG. 3 schematically shows a circuit diagram of a specific configuration of a sense amplifier according to an embodiment of the present disclosure.

FIG. 3 schematically shows a circuit diagram of a sense amplifier according to an embodiment of the present disclosure.

In the embodiment shown in FIG. 3, the switch K1 is configured as a transistor N3, the on-off state of which is controlled in response to the control signal CM; the switch K2 is configured as a transistor N4, the on-off state of which is controlled in response to the control signal CC; the switch K3 is configured as a transistor N5, the on-off state of which is controlled in response to the control signal Tran; the switch K4 is configured as a transistor N6, the on-off state of which is controlled in response to the control signal Tran; the switch K5 is configured as a transistor N7, the on-off state of which is controlled in response to the control signal ISO; and the switch K6 is configured as a transistor N8, the on-off state of which is controlled in response to the control signal ISO.

The pre-charge unit may comprise a transistor N9, a transistor N10, and a transistor N11.

Gates of the transistor N9, the transistor N10, and transistor N11 may all receive a pre-charge control signal PCE. A source of the transistor N9 is connected to the second bit line BLB, and a drain of the transistor N9 is connected to the first bit line BL; a source of the transistor N10 is connected to the first bit line BL, and a drain of the transistor N10 is connected to a source of the transistor N11 and connected to the pre-charge voltage Veq, wherein the pre-charge voltage Veq may be configured as VCC/2; and a drain of the transistor N11 is connected to the second bit line BLB.

Figure 4:
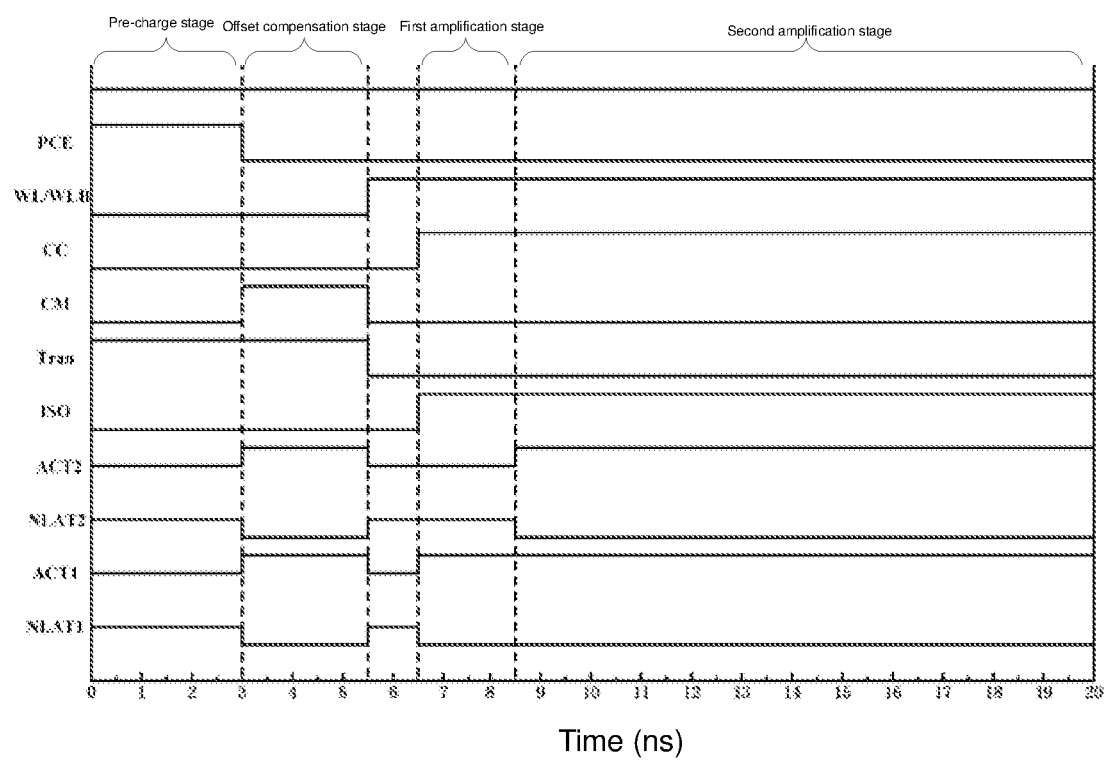
FIG. 4 schematically shows a timing diagram of various control signals involved in a sense amplifier according to an embodiment of the present disclosure.

The storage unit corresponding to the first bit line BL is configured to comprise a transistor N12 and a capacitor C1, and the on-off state of the transistor N12 is controlled in response to a word line control signal WL; and the storage unit corresponding to the second bit line BLB is configured to comprise a transistor N13 and a capacitor C2, and the on-off state of the transistor N13 is controlled in response to a word line control signal WLB. FIG. 4 schematically shows a timing diagram of various control signals according to an embodiment of the present disclosure. It should be noted that FIG. 4 is only a schematic diagram, and the abscissa time value shown in the figure forms no limitation to the embodiment of the present disclosure.

The working stages of the sense amplifier according to some embodiments of the present disclosure will be described below in combination with the timing diagram of FIG. 4.

Figure 5:
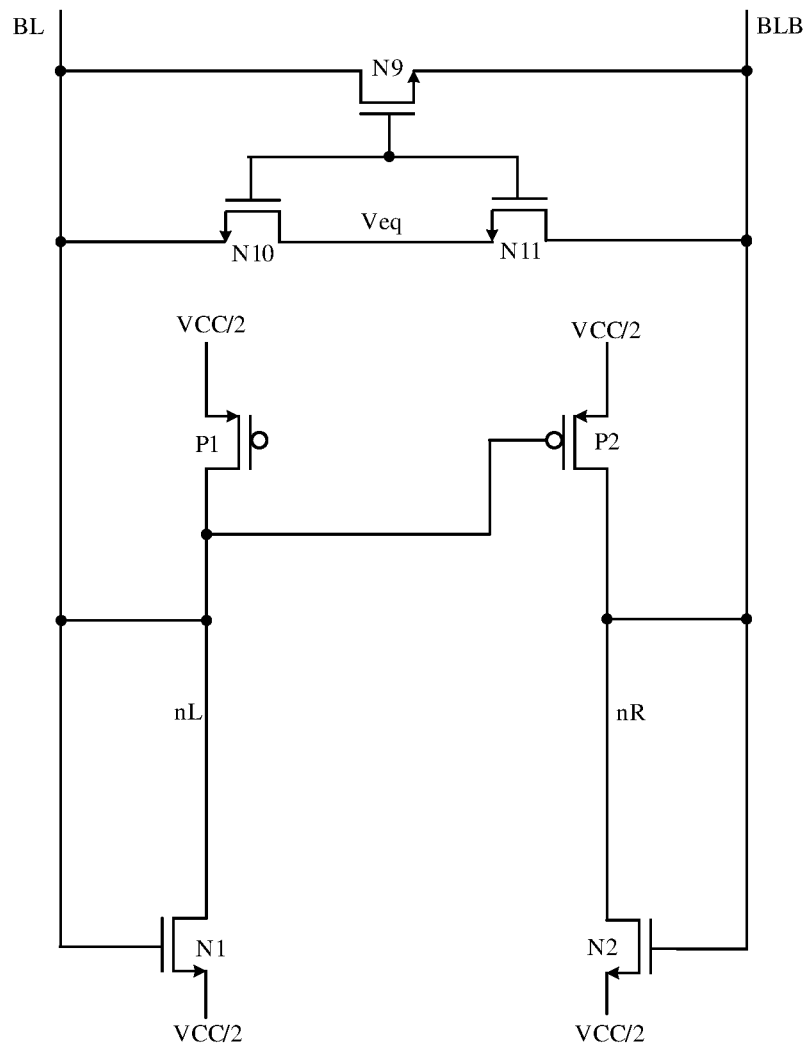
FIG. 5 schematically shows a circuit diagram of a sense amplifier in a pre-charge stage according to an embodiment of the present disclosure.

FIG. 5 shows the pre-charge stage of the sense amplifier. The voltages of the control signal PCE, the control signal Tran, the control signal ACT1, the control signal ACT2, the control signal NLAT1, and the control signal NLAT2 may be 1.5×VCC, 1.5×VCC, VCC/2, VCC/2, VCC/2, VCC/2, respectively, and the voltages of other control signals is 0.

Correspondingly, the transistor N9, the transistor N10, the transistor N11, the transistor N5, and the transistor N6 are turned on (corresponding to the closed state of the switches). The transistor N3, the transistor N4, the transistor N7, and the transistor N8 are turned off (corresponding to the open state of the switches).

In this case, the first bit line BL and the second bit line BLB are connected to the pre-charge voltage Veq through the transistor N10 and the transistor N11, respectively, and connected to each other through the transistor N9, so that the first bit line BL and the second bit line BLB are pre-charged to Veq. In addition, since the transistor N5 and the transistor N6 are turned on, the first node nL and the second node nR are also pre-charged to Veq.

It should be noted that, in the pre-charge stage, the transistor N3, the transistor N4, the transistor N7, and the transistor N8 may also be in the closed state, and this may be set according to actual needs.

Figure 6:
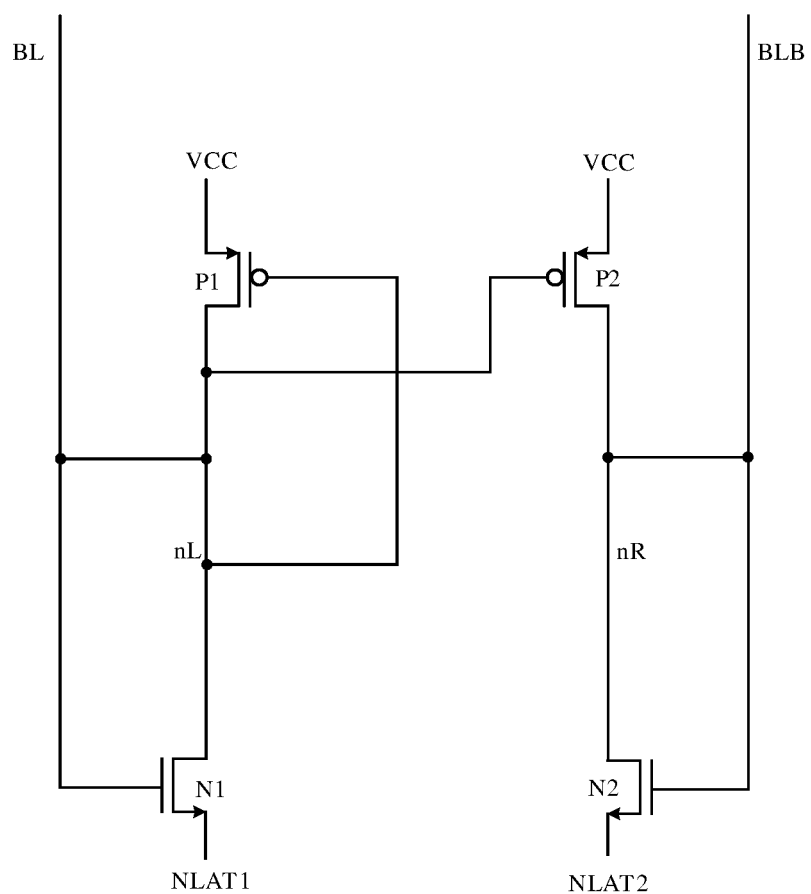
FIG. 6 schematically shows a circuit diagram of a sense amplifier in an offset compensation stage according to an embodiment of the present disclosure.

FIG. 6 shows the offset compensation stage of the sense amplifier. The voltages of the control signal ACT1, the control signal NLAT1, the control signal ACT2, the control signal NLAT2, the control signal Tran, and the control signal CM are VCC, 0, VCC, 0, 1.5×VCC, VCC, respectively.

In this case, the transistor N3, the transistor N5, and the transistor N6 are turned on, so that the transistor P1 and the transistor N1 form an inverter with an input and an output connected together. Because the transistor N3 is turned on, the transistor P1 and the transistor P2 form a current mirror structure.

After the pre-charge stage, if there is mismatch in the circuit, that is, the mismatch caused by the inconsistency of the transistor P1 and the transistor P2 or the mismatch caused by the inconsistency of the transistor N1 and the transistor N2, the current flowing through the transistor P1 and the transistor N1 is not equal to the current flowing through the transistor P2 and the transistor N2, that is, the driving capabilities of the two inverters are not the same, which increases the probability of data read errors.

Through the offset compensation stage shown in FIG. 6, based on the inverter with an input and an output connected together, the first bit line BL can be compensated to the flip point of the inverter, and the flip voltage varies based on the degree of the offset. In addition, the flip voltage of the inverter composed of the transistor P1 and the transistor N1 is the gate voltage of the transistor P2. Since, in this case, the transistor P1 and the transistor P2 form a current mirror structure, the current on the branch of the transistor P1 and the transistor N1 is approximately equal to the current on the branch of the transistor P2 and the transistor N2. For the transistor N2, its gate and drain are connected to form a diode structure and connected to the second bit line BLB, thereby compensating for the voltage of the second bit line BLB. In this case, the voltage on the second bit line BLB will change, causing the overdrive voltage of the transistor N2 to change to meet the requirements of the current mirror.

Figure 7:
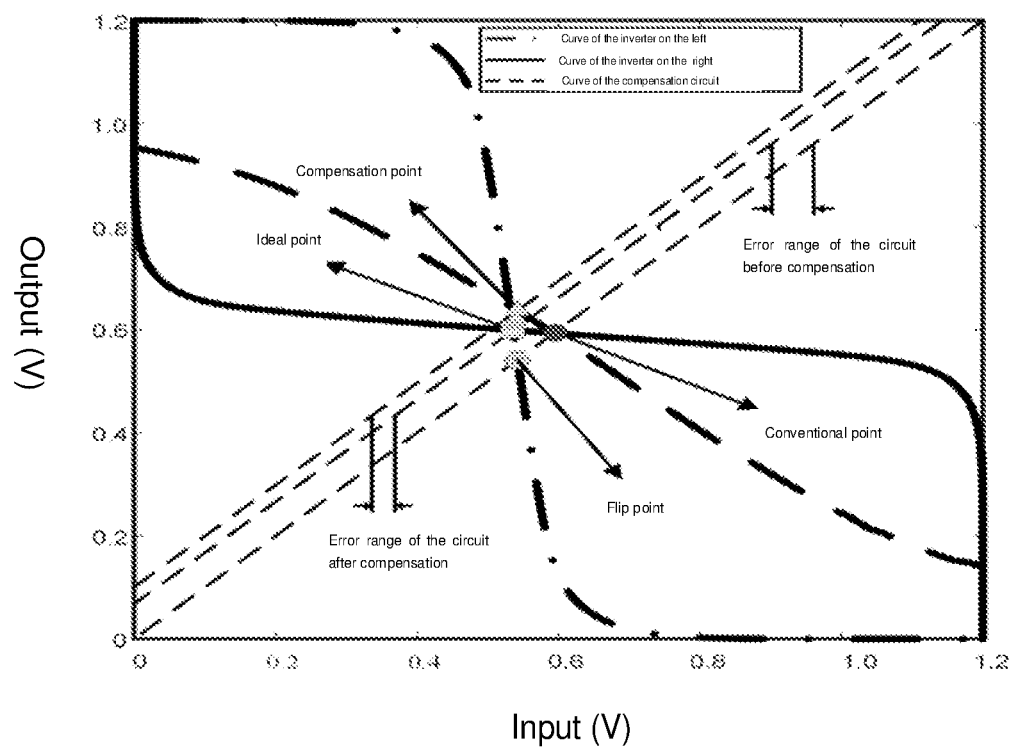
FIG. 7 shows a schematic simulation diagram of the offset compensation stage according to an embodiment of the present disclosure.

FIG. 7 shows a schematic simulation diagram of the offset compensation stage according to an embodiment of the present disclosure. The simulation conditions are as follows: the conductivity factor of the N-type transistor is the same as that of the P-type transistor, the threshold voltage of the transistor N1 is 150 mV lower than the threshold voltage of the transistor N2, and there is no mismatch between the transistor P1 and the transistor P2. The threshold voltage of the transistor P2 is approximately equal to the threshold voltage of the transistor N2.

The flip point identified in the drawing is: the flip voltage of the inverter composed of the transistor P1 and the transistor N1 on the left side of the sense amplifier, and the flip voltage is the intersection of the input and output curves of the inverter and y=x. The compensation point identified in the drawing is: the voltage on the first bit line BL and the second bit line BLB after the offset compensation stage. The conventional point identified in the drawing is: the intersection of the transmission curves of the cross-coupled amplifiers composed of the transistor P1, transistor P2, transistor N1, and transistor N2 before the offset compensation. The ideal point identified in the drawing is: the intersection of the transmission curves of the cross-coupled amplifiers composed of the transistor P1, transistor P2, transistor N1, and transistor N2 after the offset compensation.

In addition, the horizontal distance between an oblique line passing through a compensation point and having a slope of 1 and an oblique line passing through an ideal point and having a slope of 1 is the compensated error range (error caused by the offset), and the horizontal distance between an oblique line passing through a conventional point and having a slope of 1 and the oblique line passing through an ideal point and having a slope of 1 is the uncompensated error range.

It can be found from the simulation result of FIG. 7 that the compensation point is very close to the ideal point, and the compensated error range is less than the uncompensated error range. Thus, the offset compensation stage in the exemplary implementation of the present disclosure greatly reduces the influence of the mismatch of the transistors on the circuit.

Figure 8:
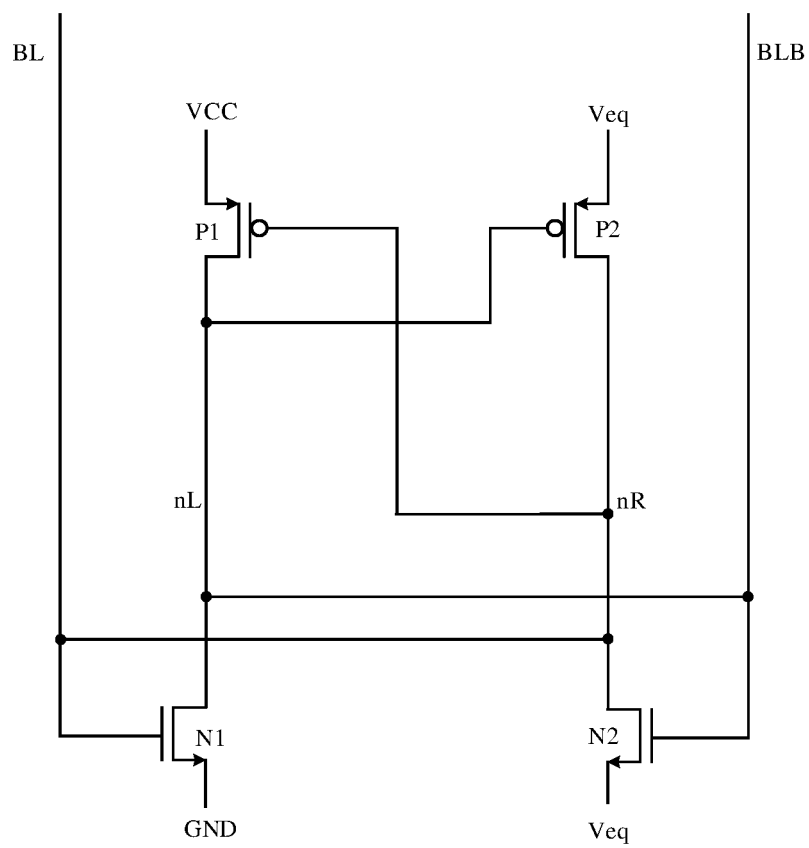
FIG. 8 schematically shows a circuit diagram of a sense amplifier in a first amplification stage according to an embodiment of the present disclosure.

FIG. 8 shows the first amplification stage of the sense amplifier, the voltages of the control signal ACT1, the control signal NLAT1, the control signal ACT2, the control signal NLAT2, the control signal CC, and the control signal ISO are VCC, 0, VCC/2, VCC/2, VCC, 1.5×VCC, respectively.

Correspondingly, the transistor N4, the transistor N7, and the transistor N8 are turned on, and since the voltages of the control signal ACT1 and the control signal NLAT1 are VCC and 0, respectively, the transistor P1 and the transistor N1 form an inverter. The input terminal of the inverter is the first bit line BL, and the output terminal thereof is the second bit line BLB. In addition, since the voltages of the control signal ACT2 and the control signal NLAT2 are both VCC/2, the transistor P2 and the transistor N2 are in the cut-off region, that is, the transistor P2 and the transistor N2 do not work.

When the sense amplifier reads 0 for the storage unit on the first bit line BL, after the word line control signal WL is at a high level, the voltage on the first bit line BL decreases, that is, the input of the inverter composed of the transistor P1 and the transistor N1 is at a relatively low level. Due to the inverter, the voltage at the output terminal of the inverter continuously increases during the first amplification stage, that is, the voltage of the second bit line BLB continuously increases.

When the sense amplifier reads 1 for the storage unit on the first bit line BL, after the word line control signal WL is at a high level, the voltage on the first bit line BL increases, that is, the input of the inverter composed of the transistor P1 and the transistor N1 is at a relatively high level. Due to the inverter, the voltage at the output terminal of the inverter continuously decreases during the first amplification stage, that is, the voltage of the second bit line BLB continuously decreases.

Therefore, in the first amplification stage of the sense amplifier according to the present disclosure, the voltage difference between the first bit line BL and the second bit line BLB will be greatly increased, which helps to further amplify the voltage difference between the two, thereby improving the speed of reading data, and also helps to avoid the amplification of data by mistake.

Figure 9:
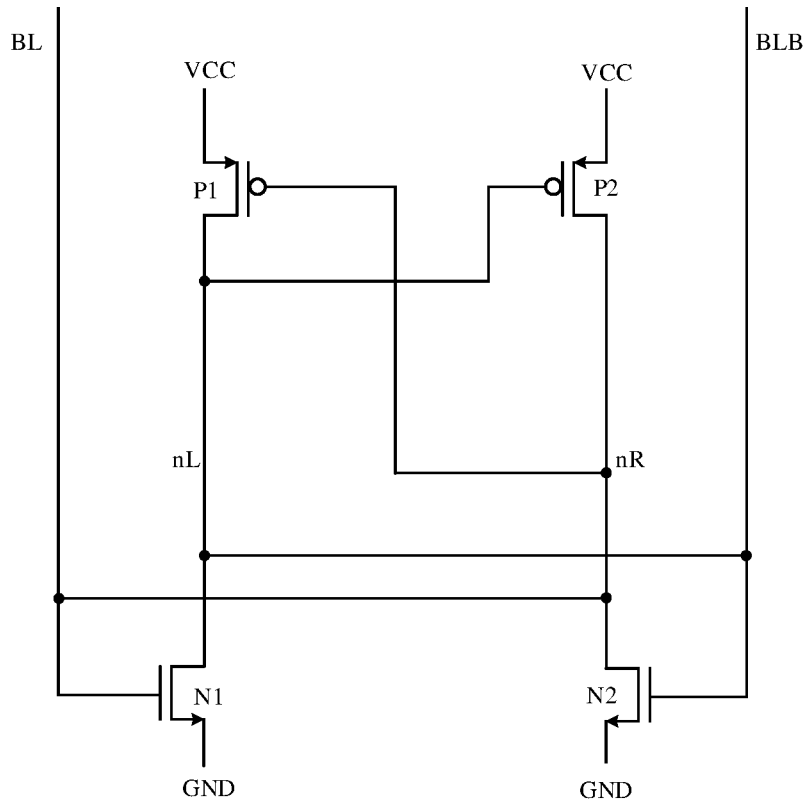
FIG. 9 schematically shows a circuit diagram of a sense amplifier in a second amplification stage according to an embodiment of the present disclosure.

FIG. 9 shows the second amplification stage of the sense amplifier. The voltages of the control signal ACT1, the control signal NLAT1, the control signal ACT2, the control signal NLAT2, the control signal CC, and the control signal ISO are VCC, 0, VCC, 0, VCC, 1.5×VCC, respectively. Compared with the circuit configuration shown in FIG. 8, the voltages of the control signal ACT2 and the control signal NLAT2 are switched to VCC and 0, respectively. Thus, the transistor P1, the transistor P2, the transistor N1, and the transistor N2 form a cross-coupled amplification structure.

When the sense amplifier reads 0 for the storage unit on the first bit line BL, the voltage on the first bit line BL is lower than the voltage on the second bit line BLB. In this case, the transistor N2 and the transistor N7 are turned on, and the voltage on the first bit line BL may be discharged to the ground through the transistor N2. In addition, the transistor P1 is turned on, and the voltage on the second bit line BLB is increased to VCC.

When the sense amplifier reads 1 for the storage unit on the first bit line BL, the voltage on the first bit line BL is higher than the voltage on the second bit line BLB. In this case, the transistor N1 and the transistor N8 are turned on, and the voltage on the second bit line BLB is discharged to the ground through the transistor N1. In addition, the transistor P2 is turned on, and the voltage on the first bit line BL is increased to VCC.

Therefore, by this cross-coupled amplification structure, the small voltage difference read from the storage unit by the bit line can be amplified to the full swing (0 or 1).

It should be noted that there may be a transition stage between the offset compensation stage and the first amplification stage. In the transition stage, the word line is turned on, the second control signal CC and the eighth control signal ISO are in the low state, and the control transistor N4, the transistor N7 and the transistor N8 are in the turned-off state, which is beneficial for the charges in the storage unit to be fully shared to the first bit line or the second bit line after the word line is turned on. However, the present disclosure is not limited thereto and the stages may be set according to actual needs.

Further, the present disclosure provides a method for controlling a sense amplifier.

Figure 10:
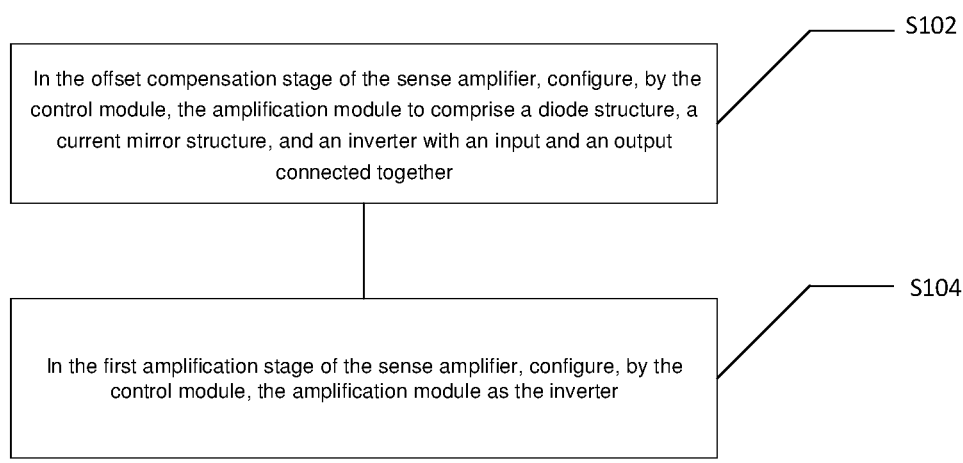
FIG. 10 schematically shows a flowchart of a method for controlling a sense amplifier according to an exemplary implementation of the present disclosure.

FIG. 10 schematically shows a flowchart of a method for controlling a sense amplifier according to an exemplary implementation of the present disclosure. As shown, the sense amplifier may comprise an amplification module and a control module.

Referring to FIG. 10, the method for controlling a sense amplifier may comprise the following steps:

S102: in the offset compensation stage of the sense amplifier, configuring, by the control module, the amplification module to comprise a diode structure, a current mirror structure, and an inverter with an input and an output connected together; and S104: in the first amplification stage of the sense amplifier, configuring, by the control module, the amplification module as an inverter.

As described above, the sense amplifier may further comprise a pre-charge stage and a second amplification stage. The details of these have been explained in the process of describing the sense amplifier above, and will not be repeated here.

By the method for controlling a sense amplifier according to the exemplary implementation of the present disclosure, the voltages on the bit lines on both sides of the sense amplifier can be adjusted, so as to compensate for the influence of offset noise on the voltages on the bit lines on both sides of the sense amplifier, thereby improving the performance of semiconductor memories.

Further, the present disclosure further provides a memory, comprising the sense amplifier described above.

Since the memory according to the exemplary implementation of the present disclosure realizes offset compensation and has a low read error rate, the performance of the memories is greatly improved.

Those skilled in the art will readily think of other embodiments of the present disclosure by considering the specification and practicing the disclosure disclosed herein. The present application is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the claims.

It should be understood that the present disclosure is not limited to the precise structures that have been described above and shown in the drawings, and various modifications and changes may be made without departing from its scope. The scope of the present disclosure is defined only by the appended claims.

The invention claimed is:

1. A sense amplifier, comprising:
an amplification module; and
a control module, electrically connected to the amplification module;
wherein, in an offset compensation stage of the sense amplifier, the control module is used to configure the amplification module to comprise a diode structure, a current mirror structure, and an inverter with an input and an output connected together; and in a first amplification stage of the sense amplifier, the control module is used to configure the amplification module as the inverter.

2. The sense amplifier according to claim 1, wherein the amplification module comprises:
a first PMOS transistor;
a second PMOS transistor, a gate of the second PMOS transistor being connected to a drain of the first PMOS transistor through a first node;
a first NMOS transistor, a gate of the first NMOS transistor being connected to a first bit line and a drain of the first NMOS transistor being connected to the first node; and
a second NMOS transistor, a gate of the second NMOS transistor being connected to a second bit line and a drain of the second NMOS transistor being connected to a drain of the second PMOS transistor through a second node;
wherein, in the offset compensation stage of the sense amplifier, the second NMOS transistor is configured as a diode structure, the first PMOS transistor and the second PMOS transistor are configured as a current mirror structure, and the first PMOS transistor and the first NMOS transistor are configured as the inverter with the input and the output connected together.

3. The sense amplifier according to claim 2, wherein the control module comprises:
a first switch, a first terminal of the first switch being connected to the first node, and a second terminal of the first switch being connected to a gate of the first PMOS transistor;
a second switch, a first terminal of the second switch being connected to the second terminal of the first switch, and a second terminal of the second switch being connected to the second node; and
a third switch, a first terminal of the third switch being connected to the first node, and a second terminal of the third switch being connected to the first bit line; and
a fourth switch, a first terminal of the fourth switch being connected to the second bit line, and a second terminal of the fourth switch being connected to the second node;
wherein, in the offset compensation stage of the sense amplifier, the first switch, the third switch, and the fourth switch are closed, and the second switch is open.

4. The sense amplifier according to claim 3, wherein, in the offset compensation stage of the sense amplifier, sources of the first PMOS transistor and the second PMOS transistor receive a first voltage, and sources of the first NMOS transistor and the second NMOS transistor are grounded.

5. The sense amplifier according to claim 4, wherein, in the first amplification stage of the sense amplifier, the second PMOS transistor and the second NMOS transistor are controlled to be in a cut-off region, and the first PMOS transistor and the first NMOS transistor are configured as the inverter.

6. The sense amplifier according to claim 5, wherein the control module further comprises:
a fifth switch, a first terminal of the fifth switch being connected to the second node, and a second terminal of the fifth switch being connected to the first bit line; and
a sixth switch, a first terminal of the sixth switch being connected to the second bit line, and a second terminal of the sixth switch being connected to the first node;
wherein, in the offset compensation stage of the sense amplifier, the fifth switch and the sixth switch are open; and in the first amplification stage of the sense amplifier, the first switch, the third switch and the fourth switch are open, and the second switch, the fifth switch, and the sixth switch are closed.

7. The sense amplifier according to claim 6, wherein, in the first amplification stage of the sense amplifier, the source of the first PMOS transistor receives the first voltage, the source of the first NMOS transistor is grounded, the source of the second PMOS transistor and the source of the second NMOS transistor receive a second voltage;
wherein, the second voltage is lower than the first voltage.

8. The sense amplifier according to claim 7, wherein, in a second amplification stage following the first amplification stage of the sense amplifier, the control module is used to configure the amplification module as a cross-coupled amplification structure.

9. The sense amplifier according to claim 8, wherein, in the second amplification stage of the sense amplifier, the first switch, the third switch, and the fourth switch are open, and the second switch, the fifth switch and the sixth switch are closed.

10. The sense amplifier according to claim 9, wherein, in the second amplification stage of the sense amplifier, the sources of the first PMOS transistor and the second PMOS transistor receive the first voltage, and the sources of the first NMOS transistor and the second NMOS transistor are grounded.

11. The sense amplifier according to claim 10, wherein the sense amplifier further comprises:
a pre-charge module, configured to pre-charge the first bit line and the second bit line in a pre-charge stage prior to the offset compensation stage of the sense amplifier.

12. The sense amplifier according to claim 11, wherein, in the pre-charge stage of the sense amplifier, the first switch, the second switch, the fifth switch and the sixth switch are open, and the third switch and the fourth switch are closed.

13. The sense amplifier according to claim 12, wherein, in the pre-charge stage of the sense amplifier, the sources of the first PMOS transistor, the second PMOS transistor, the first NMOS transistor, and the second NMOS transistor all receive the second voltage.

14. A memory, comprising the sense amplifier according to claim 1.

15. A method for controlling a sense amplifier, the sense amplifier comprising an amplification module and a control module, comprising:
in an offset compensation stage of the sense amplifier, configuring, by the control module, the amplification module to comprise a diode structure, a current mirror structure, and an inverter with an input and an output connected together; and
in a first amplification stage of the sense amplifier, configuring, by the control module, the amplification module as the inverter.

* * * * *